(12) United States Patent
Kwon et al.

(10) Patent No.: US 9,825,033 B2
(45) Date of Patent: Nov. 21, 2017

(54) SEMICONDUCTOR DEVICES AND METHODS OF MANUFACTURING THE SAME

(71) Applicant: SAMSUNG ELECTRONICS CO., LTD., Suwon-si, Gyeonggi-do (KR)

(72) Inventors: Oh-Kyum Kwon, Seongnam-si (KR); Myoung-Kyu Park, Yongin-si (KR); Chul-Ho Chung, Suwon-si (KR)

(73) Assignee: SAMSUNG ELECTRONICS CO., LTD., Suwon-Si, Gyeonggi-Do (KR)

( * ) Notice: Subject to any disclaimer, the term of this patent is extended or adjusted under 35 U.S.C. 154(b) by 0 days.

(21) Appl. No.: 15/196,400

(22) Filed: Jun. 29, 2016

(65) Prior Publication Data
US 2017/0040322 A1  Feb. 9, 2017

(30) Foreign Application Priority Data
Aug. 5, 2015 (KR) .................. 10-2015-0110566

(51) Int. Cl.
| | |
|---|---|
| H01L 21/70 | (2006.01) |
| H01L 27/092 | (2006.01) |
| H01L 29/161 | (2006.01) |
| H01L 29/10 | (2006.01) |
| H01L 29/78 | (2006.01) |
| H01L 29/08 | (2006.01) |
| H01L 29/423 | (2006.01) |
| H01L 21/02 | (2006.01) |
| H01L 21/8238 | (2006.01) |
| H01L 21/8256 | (2006.01) |

(52) U.S. Cl.
CPC .... *H01L 27/0922* (2013.01); *H01L 21/02532* (2013.01); *H01L 21/8256* (2013.01); *H01L 21/823814* (2013.01); *H01L 29/0847* (2013.01); *H01L 29/1079* (2013.01); *H01L 29/161* (2013.01); *H01L 29/42364* (2013.01); *H01L 29/7833* (2013.01)

(58) Field of Classification Search
CPC ............ H01L 21/8228; H01L 21/8238; H01L 27/0826; H01L 27/092; H01L 21/02532
USPC ..... 257/61, 63, 346, 382, E29.021, E29.039, 257/E29.116, E29.121, E29.131, E29.266, 257/E29.268, E29.278, E21.207, E21.433, 257/E21.435, 499–500
See application file for complete search history.

(56) References Cited

U.S. PATENT DOCUMENTS

| | | | |
|---|---|---|---|
| 6,111,267 A | 8/2000 | Fischer et al. | |
| 6,238,982 B1 * | 5/2001 | Krivokapic ..... | H01L 21/823412 257/E21.618 |
| 7,084,026 B2 | 8/2006 | Takagi et al. | |
| 7,491,988 B2 | 2/2009 | Tolchinsky et al. | |
| 7,691,698 B2 * | 4/2010 | Chidambarrao | H01L 21/823807 257/369 |
| 8,575,655 B2 | 11/2013 | Bedell et al. | |

(Continued)

*Primary Examiner* — Sonya D McCall Shepard
(74) *Attorney, Agent, or Firm* — Lee & Morse P.C.

(57) ABSTRACT

An integrated circuit device includes a substrate including a first region and a second region, a first transistor in the first region, the first transistor being an N-type transistor and including a first silicon-germanium layer on the substrate, and a first gate electrode on the first silicon-germanium layer, and a second transistor in the second region and including a second gate electrode, the second transistor not having a silicon-germanium layer between the substrate and the second gate electrode.

19 Claims, 12 Drawing Sheets

(56) References Cited

U.S. PATENT DOCUMENTS

| | | |
|---|---|---|
| 8,975,642 B2 | 3/2015 | Zhao et al. |
| 9,064,699 B2 | 6/2015 | Wang et al. |
| 2004/0124479 A1* | 7/2004 | Takeshi ............... H01L 21/2807 257/408 |
| 2006/0105528 A1* | 5/2006 | Cho ................ H01L 21/823807 438/275 |
| 2007/0187797 A1* | 8/2007 | Kato ............... H01L 21/823807 257/500 |
| 2008/0079086 A1 | 4/2008 | Jung et al. |
| 2008/0116487 A1* | 5/2008 | Lee .................... H01L 21/2683 257/194 |
| 2012/0161249 A1 | 6/2012 | Kronholz et al. |
| 2015/0162323 A1* | 6/2015 | Taya .................. H01L 27/0629 257/296 |

* cited by examiner

SEMICONDUCTOR DEVICES AND METHODS OF MANUFACTURING THE SAME

CROSS-REFERENCE TO RELATED APPLICATION

Korean Patent Application No. 10-2015-0110566, filed on Aug. 5, 2015, in the Korean Intellectual Property Office, and entitled: "Semiconductor Devices and Methods of Manufacturing the Same," is incorporated by reference herein in its entirety.

BACKGROUND

1. Field

Embodiments relate to semiconductor devices and methods of manufacturing the same.

2. Description of the Related Art

As the electronic industry is developed, the required value of reliability of a semiconductor device, e.g., operation continuity, uniformity of operation or resistance to the external environment, has been gradually increased. In an analog circuit, as the size of the semiconductor device is reduced, operation uniformity of the analog circuit may be degraded. Accordingly, in order to reduce the size of the semiconductor device, there is a need to improve the operation uniformity of the analog circuit.

SUMMARY

Example embodiments provide a semiconductor device having high reliability due to improved mis-match characteristics.

Example embodiments also provide a method of manufacturing a semiconductor device having high reliability through improving mis-match characteristics.

According to some example embodiments, an integrated circuit device may include a substrate including a first region and a second region, a first transistor in the first region, the first transistor being an N-type transistor and including a first silicon-germanium layer on the substrate, and a first gate electrode on the first silicon-germanium layer, and a second transistor in the second region and including a second gate electrode, the second transistor not having a silicon-germanium layer between the substrate and the second gate electrode.

The first transistor may further include a silicon capping layer situated between the first silicon-germanium layer and the first gate electrode.

The first transistor may include a P-type well situated in the substrate, and a P-type impurity concentration of the silicon capping layer may be less than a P-type impurity concentration of the P-type well.

The first transistor may include source/drain extension regions and source/drain regions situated at opposite sides of the first gate electrode, and a depth of each of the source/drain extension regions may be greater than a depth of each of the source/drain regions.

The first transistor may include P-type impurities that are piled up at an interface between the first silicon-germanium layer and the substrate.

The second transistor may be a P-type transistor and may include source/drain extension regions and source/drain regions situated at opposite sides of the second gate electrode, and a depth of each of the source/drain extension regions may be greater than a depth of each of the source/drain regions.

The integrated circuit device may further include a third transistor situated in a third region of the substrate.

The third transistor may be a P-type transistor.

The third transistor may include a second silicon-germanium layer on the substrate and a third gate electrode on the second silicon-germanium layer, and an operating voltage level of the second transistor may be greater than an operating voltage level of the third transistor.

The second transistor may be an N-type transistor, and an operating voltage level of the first transistor may be different from an operating voltage level of the second transistor.

The first transistor may include a first gate insulation layer situated between the first gate electrode and the first silicon-germanium layer and the second transistor may include a second gate insulation layer situated between the second gate electrode and the substrate, and a thickness of the first gate insulation layer may be greater than a thickness of the second gate insulation layer.

The second transistor may include source/drain extension regions and source/drain regions at opposite sides of the second gate electrode, and a depth of each of the source/drain extension regions may be less than a depth of each of the source/drain regions.

According to some example embodiments, an integrated circuit device may include a substrate including a first region and a second region, a first transistor situated in the first region and a second transistor situated in the second region, the first transistor may be an N-type transistor and may include a first silicon-germanium layer on the substrate and a first gate electrode on the first silicon-germanium layer, and the second transistor may include a second gate electrode on the substrate, and a width of the first gate electrode may be greater than a width of the second gate electrode.

The first transistor may include a first gate insulation layer situated between the first gate electrode and the first silicon-germanium layer, and the second transistor may include a second gate insulation layer situated between the second gate electrode and the substrate, and a thickness of the first gate insulation layer may be greater than a thickness of the second gate insulation layer.

The second transistor may be a P-type transistor and may further include a second silicon-germanium layer situated between the substrate and the second gate electrode.

The integrated circuit device may further include a third transistor situated in a third region of the substrate, the third transistor may be a P-type transistor and may include a third gate electrode on the substrate, and a width of the third gate electrode may be greater than a width of the second gate electrode, and the third transistor may be configured not to include a silicon-germanium layer between the substrate and the third gate electrode.

The second transistor may be an N-type transistor and may be configured not to include a silicon-germanium layer between the substrate and the second gate electrode.

The integrated circuit device may further include a third transistor situated in a third region of the substrate, the third transistor may be a P-type transistor and may include a second silicon-germanium layer on the substrate and a third gate electrode on the second silicon-germanium layer.

The first transistor may include first source/drain extension regions and first source/drain regions situated at opposite sides of the first gate electrode, and the second transistor may include second source/drain extension regions and second source/drain regions situated at opposite sides of the second gate electrode, and a depth of each of the first source/drain extension regions may be greater than a depth of each of the first source/drain regions, and a depth of each of the second source/drain extension regions may be less than a depth of each of the second source/drain regions.

The first region may be a high voltage transistor region and the second region may be a low voltage transistor region.

According to some example embodiments, an integrated circuit device may include a substrate including a first region and a second region, a first transistor situated in the first region and a second transistor situated in the second region, the first transistor may be an N-type transistor and may include a first silicon-germanium layer on the substrate, a silicon capping layer on the first silicon-germanium layer, a first gate electrode on the first silicon capping layer, first source/drain extension regions at opposite sides of the first gate electrode and first source/drain regions in the first source/drain extension regions, and a depth of each of the first source/drain extension regions may be greater than a depth of each of the first source/drain regions.

A depth of each of the first source/drain extension regions may be greater than a height measured from a top surface of the first silicon capping layer to a top surface of the first gate electrode.

The second transistor may be a P-type transistor and may include a second gate electrode and second source/drain extension regions and second source/drain regions situated at opposite sides of the second gate electrode, and a depth of each of the second source/drain extension regions may be greater than a depth of each of the second source/drain regions.

The second transistor may be configured not to include a silicon-germanium layer between the second source/drain extension regions.

The second transistor may include a second gate electrode situated on the substrate, and a width of the second gate electrode may be less than a width of the first gate electrode.

The second transistor may be a P-type transistor and may further include a second silicon-germanium layer situated between the second gate electrode and the substrate.

The second transistor may be an N-type transistor and may include second source/drain regions situated at opposite sides of the second gate electrode and be configured not to include a silicon-germanium layer between the second source/drain regions.

According to some example embodiments, an integrated circuit device may include a substrate including a first region and a second region, a first transistor in the first region, the first transistor being an N-type transistor and including a first gate electrode on the substrate, and a first silicon-germanium layer between the first gate electrode and the substrate, and a second transistor in the second region and including a second gate electrode, a distance between a bottom of the second gate electrode and a top of the substrate being smaller than a distance between a bottom of the first gate electrode and the top of the substrate.

The first transistor may further include a capping layer and a first gate insulting layer, the first silicon-germanium layer, the capping layer, and the first gate insulting layer being stacked on the substrate in the stated order, and the second transistor may further include a second gate insulating layer directly on the substrate.

The second transistor may further include a second gate insulating layer directly between the second gate electrode and the substrate.

A width of the first gate electrode may be greater than a width of the second gate electrode.

The first transistor may further include a P-type well in the substrate, the first silicon-germanium layer being directly on the P-type well and overlapping an entire bottom of the first gate electrode.

According to some example embodiments, a method of manufacturing an integrated circuit device may include sequentially forming a silicon-germanium layer and a silicon capping layer on a substrate including a first portion and second portions situated at opposite sides of the first portion, forming source/drain extension regions including an N-type impurity in the second portions of the substrate, the silicon-germanium layer and the silicon capping layer and forming a gate electrode on the silicon capping layer between the source/drain extension regions.

The method may further include forming source/drain regions including an N-type impurity in the source/drain extension regions using the gate electrode as a mask.

A depth of each of the source/drain regions may be less than a depth of each of the source/drain extension regions.

Forming the silicon-germanium layer may include epitaxially growing an undoped silicon-germanium layer, and the forming of the silicon capping layer may include epitaxially growing an undoped silicon layer.

Forming the source/drain extension regions may include forming a mask pattern on the silicon capping layer and injecting an N-type impurity in the second portions of the substrate, the silicon-germanium layer and the silicon capping layer using the mask pattern.

BRIEF DESCRIPTION OF THE DRAWINGS

Features will become apparent to those of ordinary skill in the art by describing in detail exemplary embodiments with reference to the attached drawings, in which.

DETAILED DESCRIPTION

Figure 1:
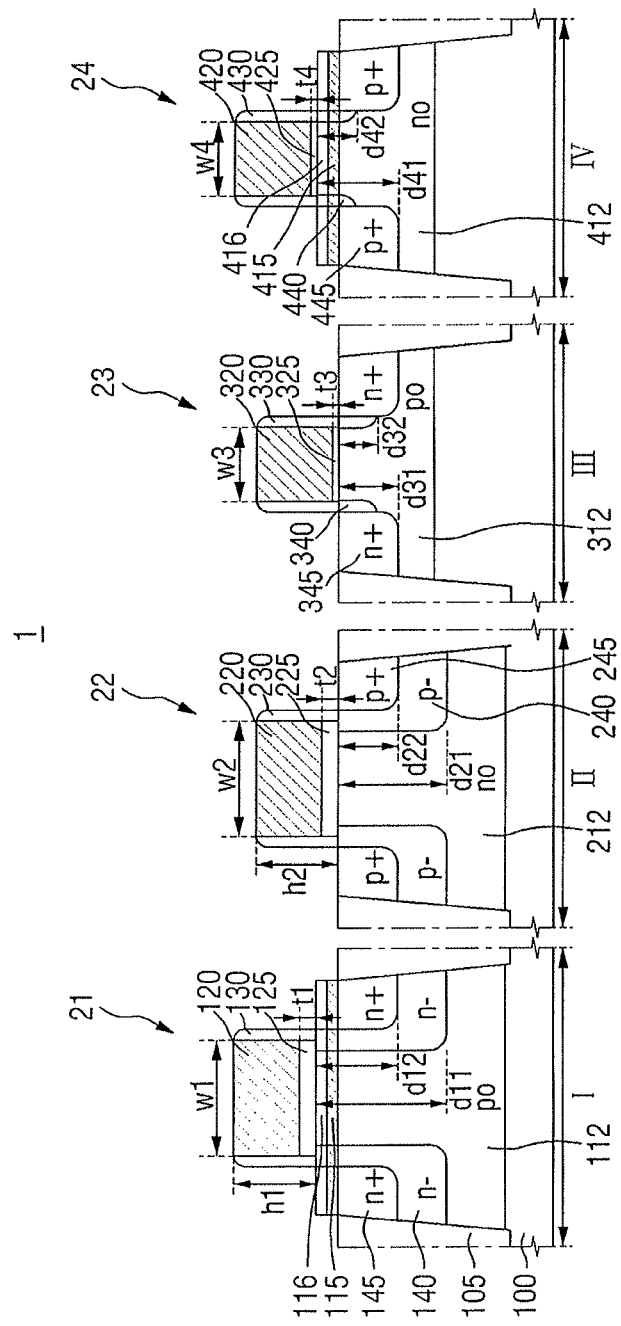
FIG. 1 illustrates a view of a semiconductor device according to some example embodiments.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. In addition, it will also be understood that when a layer is referred to as being "between" two layers, it can be the only layer between the two layers, or one or more intervening layers may also be present. Like reference numerals refer to like elements throughout.

Also, although the terms "first" and "second" are used to describe various members, components, regions, layers, and/or portions in various embodiments, the members, components, regions, layers, and/or portions are not limited to these terms. These terms are used only to differentiate one member, component, region, layer, or portion from another one. Therefore, a member, a component, a region, a layer, or a portion referred to as a first member, a first component, a first region, a first layer, or a first portion in an embodiment may be referred to as a second member, a second component, a second region, a second layer, or a second portion in another embodiment.

Unless otherwise defined, all terms used herein, including technical and scientific terms, have the same meaning as commonly understood by one of skill in the art. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

When a certain embodiment is implemented differently, a specific process order may be performed differently from the described order. For example, two consecutively described processes may be performed substantially at the same time or performed in an order opposite to the described order.

As used herein, the term "and/or" includes any and all combinations of one or more of the associated listed items. Expressions such as "at least one of," when preceding a list of elements, modify the entire list of elements and do not modify the individual elements of the list.

As in the following, a method of manufacturing an integrated circuit device according to some example embodiments will be described in detail with reference to FIGS. 1 through 13.

Figure 2:
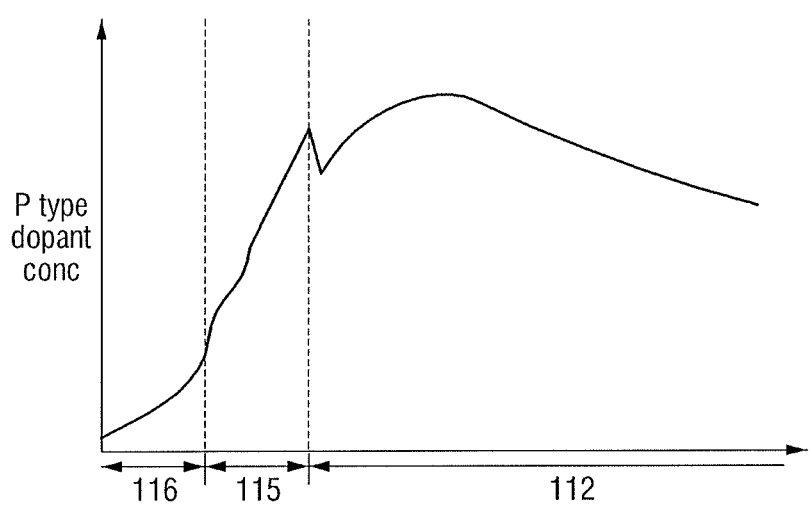
FIG. 2 illustrates a view of a concentration profile of a P-type impurity in a first region I of FIG. 1.

FIG. 1 is a view illustrating a semiconductor device according to some example embodiments. FIG. 2 is a view illustrating a concentration profile of a P-type impurity in a first region I of FIG. 1.

Referring to FIGS. 1 and 2, a semiconductor device 1 according to some example embodiments may include a first transistor 21 in the first region I, a second transistor 22 in a second region II, a third transistor 23 in a third region III, and a fourth transistor 24 in a fourth region IV. A substrate 100 of the semiconductor device 1 may include the first to fourth regions I, II, III, and IV, and the first to fourth regions I, II, III and IV may be spaced apart from each other or may be connected to each other.

The first region I and the second region II of the substrate 100 may be regions for forming a high voltage transistor, and the third region III and the fourth region IV may be regions for forming a low voltage transistor. In this case, the terms "high voltage" and "low voltage" refer to a relative value of voltage, rather than an absolute value of voltage. In addition, the first region I and the third region III may be regions for forming an N-type MOS transistor, and the second region II and the fourth region IV may be regions for forming a P-type MOS transistor.

An operating voltage level of the first transistor 21 may be greater than an operating voltage level of the third transistor 23. Furthermore, an operating voltage level of the second transistor 22 may be greater than an operating voltage level of the fourth transistor 24.

For example, the substrate 100 may include a base substrate and an epitaxial layer grown on the base substrate, but it is not limited thereto. In another example, the substrate 100 may include only the base substrate with no the epitaxial layer. The substrate 100 may include, e.g., a silicon substrate, a gallium arsenide (GaAs) substrate, a silicon germanium (SiGe) substrate, a ceramic substrate, a quartz substrate, a glass substrate for a display or a semiconductor-on-insulator (SOI) substrate. Hereinafter, the silicon substrate will be described as an example of the substrate 100.

A device isolation region 105 may be situated within the substrate 100 to delimit an active region. The device isolation region 105 may include a shallow trench isolation (STI) region, but it is not limited thereto.

The first transistor 21 may include a first well 112, a first silicon-germanium layer 115, a first gate insulation layer 125, a first gate electrode 120, a pair of first source/drain extension regions 140, and a pair of first source/drain regions 145.

The first well 112 may be situated in the first region I of the substrate 100 delimited by the device isolation region 105. The first transistor 21 may be an N-type transistor, and the first well 112 may be a P-type well P0. A P-type impurity contained in the first well 112 may be, e.g., boron (B).

The first silicon-germanium layer 115 may be situated, e.g., directly, on the first well 112 that is situated within the substrate 100. The first silicon-germanium layer 115 may be an epitaxial layer. The first silicon-germanium layer 115 may include an undoped silicon-germanium epitaxial layer. In this case, the term "undoped" means that an impurity is not intentionally injected in the first silicon-germanium layer 115 by a manufacturer of a semiconductor device, i.e., does not mean that the first silicon-germanium layer 115 does not include an impurity. In other words, the first silicon-germanium layer 115 may include an impurity migrated from the first well 112 by a diffusion or the like.

The first transistor 21 may further include a first silicon capping layer 116 that is situated, e.g., directly, on the first silicon-germanium layer 115. The first silicon capping layer 116 may include an epitaxial layer.

The first silicon capping layer 116 may be formed of an undoped silicon epitaxial layer by an epitaxial growth process. Similarly to the first silicon-germanium layer 115, the first silicon capping layer 116 may include an impurity migrated from the first well 112 through the first silicon-germanium layer 115 by a diffusion or the like.

FIG. 2 illustrates P-type impurity concentration profiles in respective regions of the first well 112, the first silicon-germanium layer 115, and the first silicon capping layer 116 that are overlapped with the first gate electrode 120 as viewed in a cross-section.

In FIG. 2, a concentration of a P-type impurity contained in the first well 112 may be greater than a concentration of a P-type impurity contained in the first silicon capping layer 116. In addition, since the P-type impurities (e.g., boron) contained in the first well 112 may not be easily diffused in a silicon-germanium crystal, P-type impurities may be piled-up at an interface between the first silicon-germanium layer 115 and the first well 112 of the substrate 100.

The first gate electrode 120 may be situated on the first silicon capping layer 116. The first silicon capping layer 116 may be interposed between the first gate electrode 120 and the first silicon-germanium layer 115.

The first gate electrode 120 may include, e.g., polysilicon, amorphous silicon, titanium (Ti), titanium nitride (TiN), tungsten nitride (WN), titanium aluminium (TiAl), titanium aluminium nitride (TiAlN), tantalum nitride (TaN), titanium carbide (TiC), tantalum carbide (TaC), tantalum carbon nitride (TaCN), tantalum silicon nitride (TaSiN), tantalum (Ta), cobalt (Co), ruthenium (Ru), aluminium (Al), tungsten (W) or any of various combinations of the same.

The first gate insulation layer 125 may be interposed between the first gate electrode 120 and the first silicon capping layer 116. The first gate insulation layer 125 may include, e.g., a silicon oxide layer, a silicon nitride layer, a silicon oxynitride layer, a $Ge_xO_yN_z$ layer, a $Ge_xSi_yO_z$ layer, a high-k dielectric layer or any of various combinations of the same. The high-k dielectric layer may include, e.g., hafnium oxide, hafnium silicon oxide, lanthanum oxide, lanthanum aluminium oxide, zirconium oxide, zirconium silicon oxide, tantalum oxide, titanium oxide, barium strontium titanium oxide, barium titanium oxide, strontium titanium oxide, yttrium oxide, aluminium oxide, lead scandium tantalum oxide, lead zinc niobate or any of various combinations of the same, but it is not limited thereto.

A pair of first gate spacers 130 may be situated on both sidewalls of the first gate electrode 120, respectively. Each of the first gate spacers 130 may include, e.g., silicon nitride (SiN), silicon oxynitride (SiON), silicon oxide ($SiO_2$), silicon oxy-carbon nitride (SiOCN), silicon carbon nitride (SiCN) or any of various combinations of the same.

The pair of first source/drain extension regions 140 may be situated within the first silicon capping layer 116, the first silicon-germanium layer 115, and the substrate 100 at opposite sides of the first gate electrode 120. When the first transistor 21 is an N-type transistor, the first source/drain extension region 140 may include an N-type conductivity region n−. An N-type impurity contained in the first source/drain extension region 140 may include, e.g., phosphorus (P), arsenic (As), antimony (Sb).

The pair of first source/drain regions 145 may be situated within the first silicon capping layer 116, the first silicon-germanium layer 115, and the substrate 100 at opposite sides of the first gate electrode 120. Each of the first source/drain regions 145 may be situated within each of the first source/drain extension regions 140. In other words, each of the first source/drain extension regions 140 may extend in a loop around each of the first source/drain regions 145.

Similarly to the first source/drain extension region 140, the first source/drain region 145 may include an N-type conductivity region n+. An N-type impurity contained in the first source/drain region 145 may include, e.g., phosphorus (P), arsenic (As), antimony (Sb). A concentration of the N-type impurity of the first source/drain region 145 may be greater than a concentration of the N-type impurity of the first source/drain extension region 140.

When viewed from a cross-sectional view, a depth d11 of the first source/drain extension region 140 may be greater than a depth d12 of the first source/drain region 145. In other words, a depth measured from a bottom surface of the first gate insulation layer 125 to a bottommost surface of the first source/drain extension region 140 may be greater than a depth measured from the bottom surface of the first gate insulation layer 125 to a bottommost surface of the first source/drain region 145. A bottom surface of the first source/drain extension region 140 may be further away from the first gate electrode 120 than a bottom surface of the first source/drain region 145.

The first transistor 21 may be a high voltage transistor. To ensure reliability in the operation of the high voltage transistor, the depth d11 of the first source/drain extension region 140 may be greater than the depth d12 of the first source/drain region 145. Furthermore, in the first transistor 21, the depth d11 of the first source/drain extension region 140 may be greater than a height h1 measured from a top surface of the first silicon capping layer 116 to a top surface of the first gate electrode 120.

In the first transistor 21, the first silicon-germanium layer 115 may be interposed between the first source/drain extension regions 140 or between the first source/drain regions 145.

The second transistor 22 may include a second well 212, a second gate insulation layer 225, a second gate electrode 220, a pair of second source/drain extension regions 240, and a pair of second source/drain regions 245.

The second well 212 may be situated in the second region II of the substrate 100 delimited by the device isolation region 105. When the second transistor 22 is a P-type transistor, the second well 212 may be an N-type well N0. An N-type impurity contained in the second well 212 may include, e.g., phosphorus (P), arsenic (As) and/or antimony (Sb).

The second gate electrode 220 may be situated on the substrate 100 where the second well 212 is situated.

The second gate insulation layer 225 may be interposed between the second gate electrode 220 and the substrate 100. A pair of second gate spacers 230 may be situated on both sidewalls of the second gate electrode 220, respectively.

The pair of second source/drain extension regions 240 may be situated within the substrate 100 at opposite sides of the second gate electrode 220. When the second transistor 22 is a P-type transistor, the second source/drain extension region 240 may include a P-type conductivity region p−. A P-type impurity contained in the second source/drain extension region 240 may include, e.g., boron (B).

The pair of second source/drain regions 245 may be situated within the second source/drain extension regions 240 at opposite sides of the second gate electrode 220. Each of the second source/drain regions 245 may be situated within each of the second source/drain extension regions 240. In other words, each of the second source/drain extension regions 240 may extend in a loop around each of the second source/drain regions 245.

Similarly to the second source/drain extension region 240, the second source/drain region 245 may include a P-type conductivity region p+. A P-type impurity contained in the second source/drain region 245 may include, e.g., boron (B). A concentration of the P-type impurity of the second source/drain region 245 may be greater than a concentration of the P-type impurity of the second source/drain extension region 240.

When viewed from a cross-sectional view, a depth d21 of the second source/drain extension region 240 may be greater than a depth d22 of the second source/drain region 245. In other words, a depth measured from a bottom surface of the second gate insulation layer 225 to a bottommost surface of the second source/drain extension region 240 may be greater than a depth measured from the bottom surface of the second gate insulation layer 225 to a bottommost surface of the second source/drain region 245. A bottom surface of the second source/drain extension region 240 may be further away from the second gate electrode 220 than a bottom surface of the second source/drain region 245.

When the second transistor 22 is a high voltage transistor, for reasons similar to those of the first transistor 21 (i.e., to ensure reliability in the operation of the high voltage transistor), the depth d21 of the second source/drain extension region 240 may be greater than the depth d22 of the second source/drain region 245. Furthermore, in the second transistor 22, the depth d21 of the second source/drain extension region 240 may be greater than a height h2 measured from a top surface of the substrate 100 to a top surface of the second gate electrode 220.

The second transistor 22 may not include a silicon-germanium layer between the second gate electrode 220 and the substrate 100 where the second well 212 is situated. In other words, a silicon-germanium layer may not be interposed between the second source/drain extension regions 240 or between the second source/drain regions 245.

The third transistor 23 may include a third well 312, a third gate insulation layer 325, a third gate electrode 320, a pair of third source/drain extension regions 340, and a pair of third source/drain regions 345.

The third well 312 may be situated within the substrate 100 of the third region III delimited by the device isolation region 105. The third transistor 23 may be an N-type transistor and thus, the third well 312 may be a P-type well P0.

The third gate electrode 320 may be situated on the substrate in which the third well 312 is situated. The third gate insulation layer 325 may be interposed between the third gate electrode 320 and the substrate 100. A pair of third gate spacers 330 may be situated on both sidewalls of the third gate electrodes 320, respectively.

The pair of third source/drain extension regions 340 may be situated within the substrate 100 at opposite sides of the third gate electrode 320. The third source/drain extension region 340 may include an N-type impurity.

The pair of third source/drain regions 345 may be situated within the third well 312 of the substrate 100 at opposite sides of the third gate electrode 320, and may be contiguous with or may contact the third source/drain extension regions 340. The third source/drain region 345 may include an N-type conductivity region n+.

The third source/drain region 345 may extend more deeply within the third well 312 of the substrate 100 than the third source/drain extension region 340. For example, when viewed from a cross-sectional view, a depth d31 of the third source/drain region 345 may be greater than a depth d32 of the third source/drain extension region 340. In other words, a depth measured from a bottom surface of the third gate insulation layer 325 to a bottommost surface of the third source/drain region 345 may be greater than a depth measured from the bottom surface of the third gate insulation layer 325 to a bottommost surface of the third source/drain extension region 340.

A bottom surface of the third source/drain region 345 may be further away from the third gate electrode 320 than a bottom surface of the third source/drain extension region 340. In addition, the pair of third source/drain extension regions 340 may be interposed between the third source/drain regions 345. Each of the third source/drain extension regions 340 may contact each of the third source/drain regions 345.

The third transistor 23 may not include a silicon-germanium layer between the third gate electrode 320 and the substrate 100 in which the third well 312 is situated. In other words, a silicon-germanium layer may not be interposed between the third source/drain extension regions 340 or between the third source/drain regions 345.

The fourth transistor 24 may include a fourth well 412, a second silicon-germanium layer 415, a fourth insulation layer 425, a fourth gate electrode 420, a pair of fourth source/drain extension regions 440, and a pair of fourth source/drain regions 445.

The fourth well 412 may be situated in the fourth region IV of the substrate 100 delimited by the device isolation region 105. The fourth transistor 24 may be a P-type transistor and thus, the fourth well 412 may be an N-type well n0.

The second silicon-germanium layer 415 may be on the substrate 100 where the fourth well 412 is situated. The second silicon-germanium layer 415 may include an epitaxial layer.

The fourth transistor 24 may further include a second silicon capping layer 416 that is situated on the second silicon-germanium layer 415. The second silicon capping layer 416 may include an epitaxial layer.

For convenience of explanation, FIG. 1 illustrates that the fourth transistor 24 includes the second silicon capping layer 416 that is situated on the second silicon-germanium layer 415, but it is not limited thereto. In other words, the second silicon capping layer 416 may not be situated on the second silicon germanium layer 415.

The fourth gate electrode 420 may be situated on the second silicon capping layer 416. The fourth gate insulation layer 425 may be interposed between the fourth gate electrode 420 and the second silicon capping layer 416. A pair of fourth gate spacers 430 may be situated on both sidewalls of the fourth gate electrode 420, respectively.

The pair of fourth source/drain extension regions 440 may be situated within the second silicon capping layer 416, the second silicon-germanium layer 415, and the substrate 100 at opposite sides of the fourth gate electrode 420. The fourth transistor 24 may be a P-type transistor and thus, the fourth source/drain extension region 440 may include a P-type impurity.

The pair of fourth source/drain regions 445 may be situated within the second silicon capping layer 416, the second silicon-germanium layer 415 and the substrate 100 at opposite sides of the fourth gate electrode 420. The fourth source/drain region 445 may be situated with the fourth well 412 and may be contiguous with or may contact the fourth source/drain extension region 440. The fourth source/drain region 445 may include a P-type conductivity region p+.

The fourth source/drain region 445 may extend more deeply within the fourth well 412 of the substrate 100 than the fourth source/drain extension region 440. For example, when viewed from a cross-sectional view, a depth d41 of the fourth source/drain region 445 may be greater than a depth d42 of the fourth source/drain extension region 440. In other words, a depth measured from a bottom surface of the fourth gate insulation layer 425 to a bottommost surface of the fourth source/drain region 445 may be greater than a depth measured from the bottom surface of the fourth gate insulation layer 425 to a bottommost surface of the fourth source/drain extension region 440.

A bottom surface of the fourth source/drain region 445 may be further away from the fourth gate electrode 420 than a bottom surface of the fourth source/drain extension region 440. In addition, the pair of fourth source/drain extension regions 440 may be interposed between the fourth source/drain regions 445. Each of the fourth source/drain extension regions 440 may contact each of the fourth source/drain regions 445. In the fourth transistor 24, the second silicon-germanium layer 415 may be interposed between the fourth source/drain extension regions 440 or between the fourth source/drain regions 445.

Respective widths of the gate electrodes 120 and 220 of the first and second transistors 21 and 22 that are situated in the high voltage transistor regions I and II may be greater than respective widths of the gate electrodes 320 and 420 of the third and fourth transistors 23 and 24 that are situated in the low voltage transistor regions III and IV. More specifically, in the N-type transistor, a width w1 of the first gate electrode 120 may be greater than a width w3 of the third gate electrode 320. In the P-type transistor, a width w2 of the second gate electrode 220 may be greater than a width w4 of the fourth gate electrode 420.

Furthermore, respective thicknesses of the gate insulation layers 125 and 225 of the first and second transistors 21 and 22 that are situated in the high voltage transistor regions I and II may be greater than respective thicknesses of the gate insulation layers 325 and 425 of the third and fourth transistors 23 and 24 that are situated in the low voltage transistor regions III and IV. More specifically, in the N-type transistor, a thickness t1 of the first gate insulation layer 125 may be greater than a thickness t3 of the third gate insulation layer 325. In the P-type transistor, a thickness t2 of the second gate insulation layer 225 may be greater than a thickness t4 of the fourth gate insulation layer 425.

In addition, in the N-type transistor, the depth d11 of the first source/drain extension region 140 may be greater than the depth d32 of the third source/drain extension region 340. In the P-type transistor, the depth d21 of the second source/drain extension region 240 may be greater than the depth d42 of the fourth source/drain extension region 440.

For convenience of explanation, FIG. 1 illustrates that each of respective depths of the first to fourth wells 112, 212, 312 and 412 is less than a depth of the device isolation region 105, but it is not limited thereto.

Since an operating voltage level of the high voltage transistor may be relatively greater than an operating voltage level of the low voltage transistor, a depth of the first well 112 may be greater than a depth of the third well 312, and a depth of the second well 212 may be greater than a depth of the fourth well 412. In such a case, the term "depth" means a size in a direction perpendicular to the substrate 100.

FIG. 1 illustrate that the first gate insulation layer 125 does not extend along the sidewall of the first gate electrode 120 between the first gate electrode 120 and the first spacer 130, but it is not limited thereto. In other words, the first gate insulation layer 125 may extend along the sidewall of the first gate electrode 120. Similarly to the first gate insulation layer 125, the second to fourth gate insulation layers 225, 325 and 425 may extend along the sidewalls of the second to fourth gate electrodes 220, 320 and 420, respectively. Furthermore, shapes of the first and second gate insulation layers 125 and 225 may be different from those of the third and fourth gate insulation layers 325 and 425.

When two adjacent transistors do not operate with a same characteristic, a characteristic of a circuit including these transistors may be degraded. In other words, when reducing the characteristic variation of the semiconductor device constituting the circuit, the circuit may be prevented from deterioration of a characteristic thereof.

When a characteristic difference between the two adjacent transistors is generated, through improving a mis-matching characteristic between the transistors, the characteristic of an analog circuit may be improved.

The mis-matching characteristic between the transistors may be inversely proportional to a gate area, and may be directly proportional to an impurity concentration. In other words, when the gate area of the transistor increases, or an impurity concentration in a channel region of the transistor decreases, the mis-matching characteristic between the transistors may be improved.

As illustrated in FIG. 2, because a P-type impurity contained in a P-type well, in which an N-type transistor is formed, may not diffuse, e.g., well, in a silicon-germanium matrix, the P-type impurity may be piled-up, e.g., accumulated, at an interface between a silicon-germanium layer and a silicon substrate, e.g., the P-type well of the silicon substrate. In other words, the silicon-germanium layer may function as a barrier that prevents or substantially minimizes the P-type impurity from diffusing out of the P-type well.

Accordingly, a P-type impurity concentration that diffuses from the P-type well to a silicon capping layer through the silicon-germanium layer may be less than a P-type impurity concentration contained in the P-type well of the silicon substrate in the absence of the silicon-germanium layer. As a result, a mis-matching characteristic of the N-type transistor with the silicon-germanium layer may be improved. Furthermore, since the P-type well is present under the silicon-germanium layer, a punch-through phenomenon of the N-type transistor with the silicon-germanium layer may also be prevented.

Figure 3:
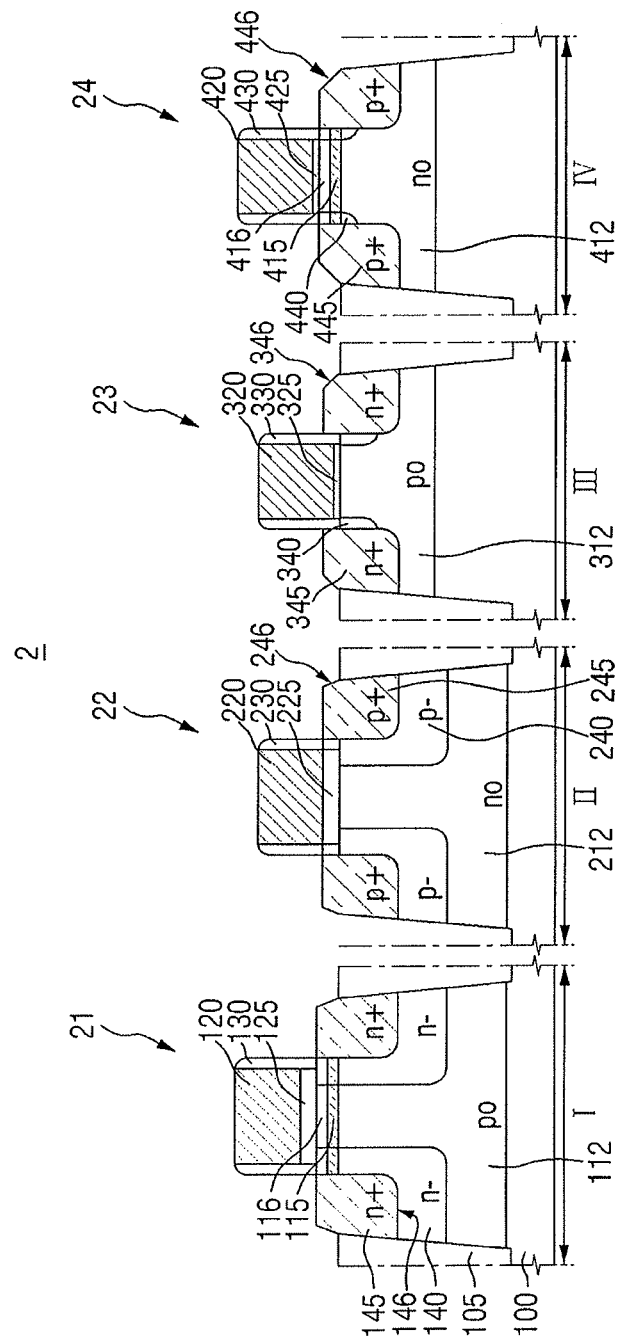
FIG. 3 illustrates a view of a semiconductor device according to some example embodiments.

FIG. 3 is a view illustrating a semiconductor device according to some example embodiments. For convenience of explanation, a description thereof will be given focusing on the differences relative to those described with reference to FIGS. 1-2.

Referring to FIG. 3, in a semiconductor device 2 according to some example embodiments, first to fourth transistors 21, 22, 23 and 24 may have first to fourth source/drain regions 145, 245, 345 and 445, respectively. Each of the first to fourth source/drain regions 145, 245, 345 and 445 may have an epitaxial pattern.

Specifically, the first source/drain region 145 may include a first semiconductor pattern 146, the second source/drain region 245 may include a second semiconductor pattern 246, and the third source/drain region 345 may include a third semiconductor pattern 346. The fourth source/drain region 445 may include a fourth semiconductor pattern 446. The first to fourth semiconductor patterns 146, 246, 346 and 446 may fill recesses that are situated within a substrate 100, respectively.

When the first and third transistors 21 and 23 are N-type MOS transistors, the first and third semiconductor patterns 146 and 346 may be the same material as the substrate 100 or may be a tensile stress material. For example, when the substrate is Si, the first and third semiconductor patterns 146 and 346 may be Si or a material having a lattice constant less than a lattice constant of Si (e.g., silicon carbide).

When the second and fourth transistors 22 and 24 are P-type MOS transistors, the second and fourth semiconductor patterns 246 and 446 may include a compressive stress material. For example, the compressive stress material may be a material that has a lattice constant greater than a lattice constant of Si (e.g., SiGe). The compressive stress material may enhance carrier mobility by applying compressive stresses to respective channel regions of the second and fourth transistors 22 and 24

In some example embodiments, only one or some of the first to fourth transistors 21, 22, 23 and 24 may include a source/drain region having a semiconductor pattern.

Figure 4:
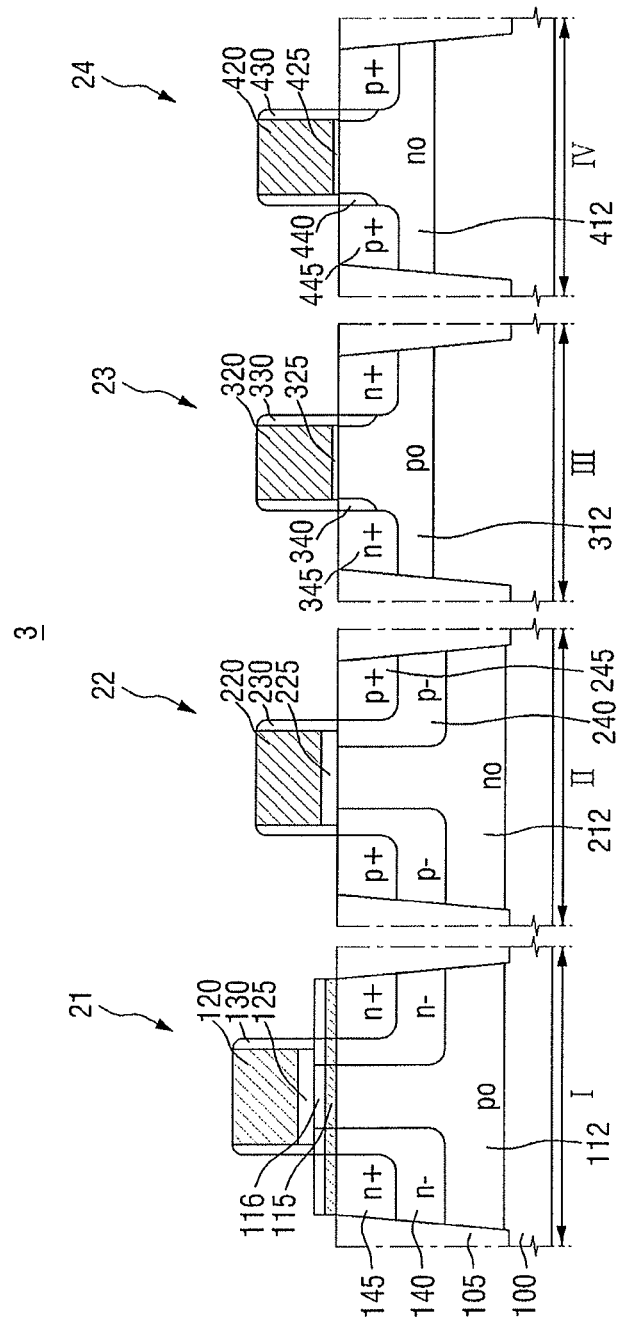
FIG. 4 illustrates a view of a semiconductor device according to some example embodiments.

FIG. 4 is a view illustrating a semiconductor device according to some example embodiments. For convenience of explanation, a description thereof will be given focusing on the differences relative to those described with reference to FIGS. 1-2.

Referring to FIG. 4, in a semiconductor device 3 according to some example embodiments, a fourth transistor 24 may not include a silicon-germanium layer between the fourth gate electrode 420 and the substrate 100. That is, a silicon-germanium layer may not be interposed between the fourth well 412 of the substrate 100 and the fourth gate insulation layer 425. In other words, a silicon-germanium layer may not be interposed between the fourth source/drain extension regions 440 and/or between the fourth source/drain regions 445.

Figure 5:
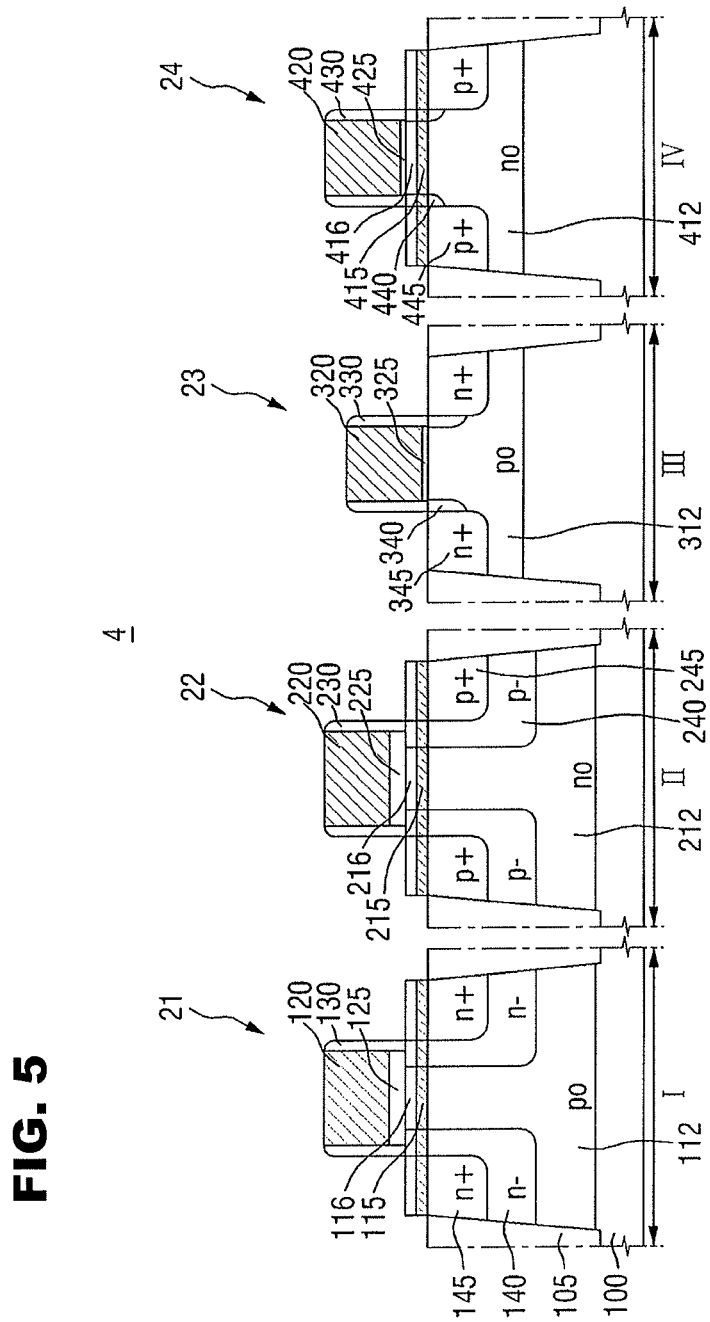
FIG. 5 illustrates a view of a semiconductor device according to some example embodiments.

FIG. 5 is a view illustrating a semiconductor device according to some example embodiments. For convenience of explanation, a description thereof will be given focusing on the differences relative to those described with reference to FIGS. 1-2.

Referring to FIG. 5, in a semiconductor device 4 according to some example embodiments, a second transistor 22 may further include a third silicon-germanium layer 215 and a third silicon capping layer 216. The third silicon-germanium layer 215 and the third silicon capping layer 216 may be interposed between the second well 212 of the substrate 100 and the second gate electrode 220.

The third silicon-germanium layer 215 may be situated on the substrate 100 where the second well 212 is situated. The third silicon-germanium layer 215 may include an epitaxial layer. As it will be described later, the third silicon-germanium layer 215 may be formed of an undoped silicon-germanium epitaxial layer by an epitaxial growth process.

The third silicon capping layer 216 may be situated on the third silicon-germanium layer 215. The third silicon capping layer 216 may include an epitaxial layer. The third silicon capping layer 216 may be formed of an undoped silicon epitaxial layer by an epitaxial growth process.

A pair of second source/drain extension regions 240 may be situated within the third silicon capping layer 216, the third silicon-germanium layer 215, and the substrate 100 at opposite sides of the second gate electrode 220.

A pair of second source/drain regions 245 may be situated within the second silicon capping layer 216, the second silicon-germanium layer 215 and the substrate 100 at opposite sides of the second gate electrode 220. Each of the second source/drain regions 245 may be situated within each of the second source/drain extension regions 240. In other words, each of the second source/drain extension regions 240 may extend in a loop around each of the second source/drain regions 245.

The third silicon-germanium layer 215 may be situated between the second source/drain extension regions 240 and/or between the second source/drain regions 245 in the second transistor 22.

For convenience of explanation, FIG. 5 illustrates that the second transistor 22 includes the third silicon capping layer 216 that is situated on the third silicon-germanium layer 215, but it is not limited thereto. In other words, the second transistor 22 may not include the third silicon capping layer 216 on the third silicon-germanium layer 215.

Figure 6:
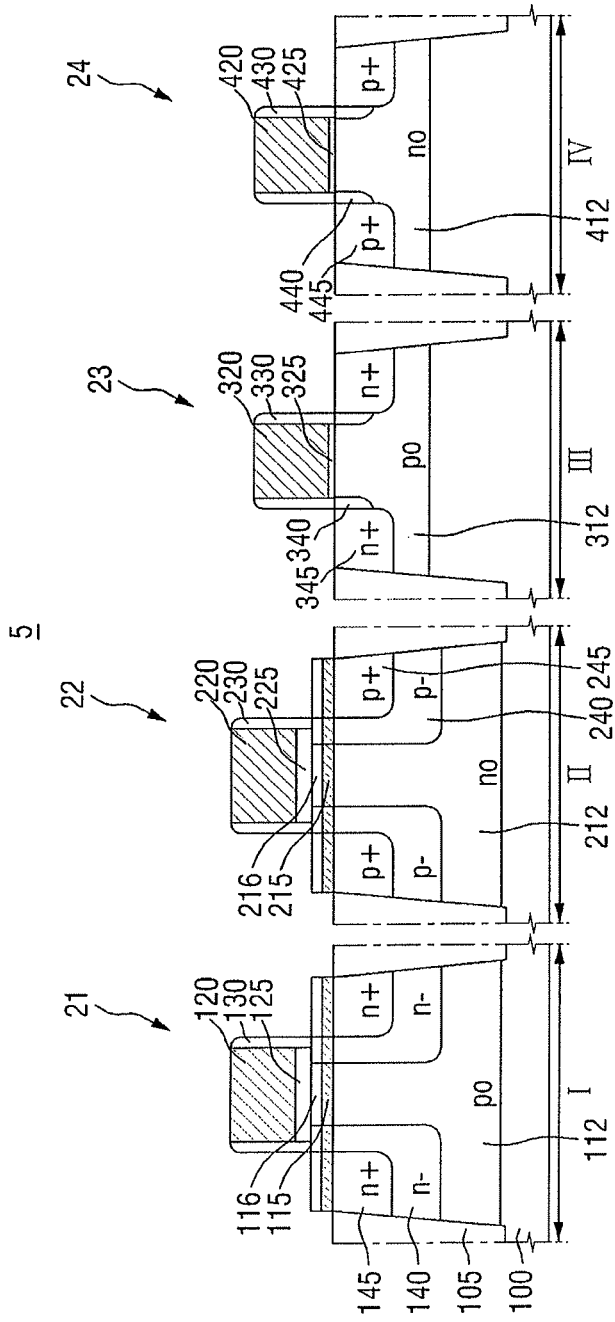
FIG. 6 illustrates a view of a semiconductor device according to some example embodiments.

FIG. 6 is a view illustrating a semiconductor device according to some example embodiments. For convenience of explanation, a description thereof will be given focusing on the differences relative to those described with reference to FIGS. 1-2.

Referring to FIG. 6, a semiconductor device 5 according to some example embodiments may include the first transistor 21 and the second transistor 22 in a high voltage transistor region. The first transistor 21 may include the silicon-germanium layer 115 that is situated between the silicon capping layer 116 and the substrate 100. The second transistor 22 may include the silicon-germanium layer 215 that is situated between the silicon capping layer 216 and the substrate 100.

On the other hand, each of third and fourth transistors 23 and 24 that are situated in a low voltage transistor region may not include a silicon-germanium layer between the substrate 100 and a gate electrode 320 or 420. A silicon-germanium layer may not be situated between third source/drain extension regions 340 or between third source/drain regions 345 in the third transistor 23. Furthermore, a silicon-germanium layer may not be situated between fourth source/drain extension regions 440 or between fourth source/drain regions 445 in the fourth transistor 24.

Figure 7:
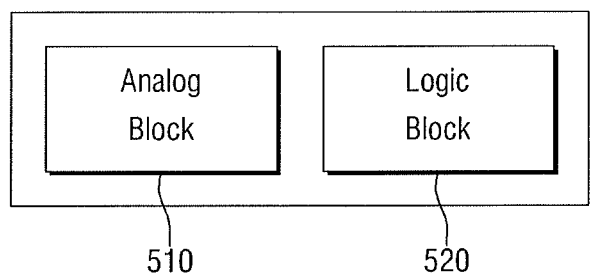
FIG. 7 illustrates a conceptual diagram of a semiconductor device according to some example embodiments.

FIG. 7 is a conceptual diagram illustrating a semiconductor device according to some example embodiments.

Referring to FIG. 7, a semiconductor device 6 according to some example embodiments may include an analog block 510 and a logic block 520.

A transistor that is situated in the logic block 520 may operate by exchanging signals with, e.g., a transistor that is situated in the analog block 510. The transistor of the analog block 510 may include a transistor having a high operation voltage. The transistor of the logic block 520 may include a transistor having a low operation voltage.

For example, the transistor of the analog block 510 may include the first and second transistors 21 and 22 in any of the semiconductor devices 1, 2, 3, 4 and 5 according to the described example embodiments. The transistor of the logic block 520 may include the third and fourth transistors 23 and 24 in any of the semiconductor devices 1, 2, 3, 4 and 5 according to the described example embodiments.

Figure 8:
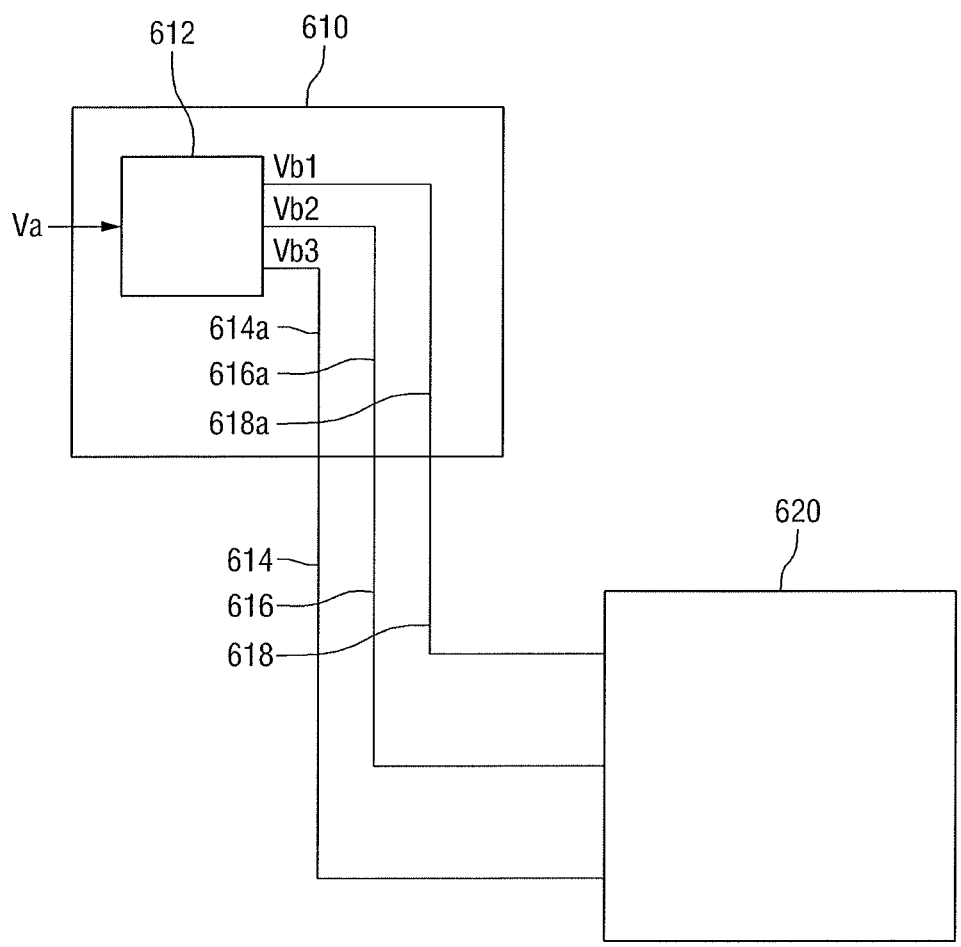
FIG. 8 illustrates a block diagram of a semiconductor system according to some example embodiments.

FIG. 8 is a block diagram illustrating a semiconductor system according to some example embodiments.

Referring to FIG. 8, a semiconductor system 11 according to some example embodiments may include a semiconductor chip 610 and a module 620 that are electrically connected to each other.

The semiconductor chip 610 may include a chip, e.g., a system on chip (SOC), a microcontroller unit (MCU) or a display driver IC (DDI). The chip may include, e.g., a processor, a memory, a logic circuit, an audio and video processing circuit, and/or a various interface circuit, but it is not limited thereto. In addition, the semiconductor chip 610 may include multiple MOS transistors having various driving voltages (e.g., a high voltage transistor and a low voltage transistor). Each of the high and low voltage transistors may be one of the semiconductor devices 1 to 6 according to the previously described example embodiments.

The semiconductor chip 610 may include a voltage generator 612 that generates at least one of internal voltages Vb1 to Vb3 using an external voltage Va. Furthermore, the semiconductor chip 610 may include at least one of internal wirings 614a, 616a, and 618a for transmitting at least one of the internal voltages Vb1 to Vb3 to the module 620.

Figure 9:
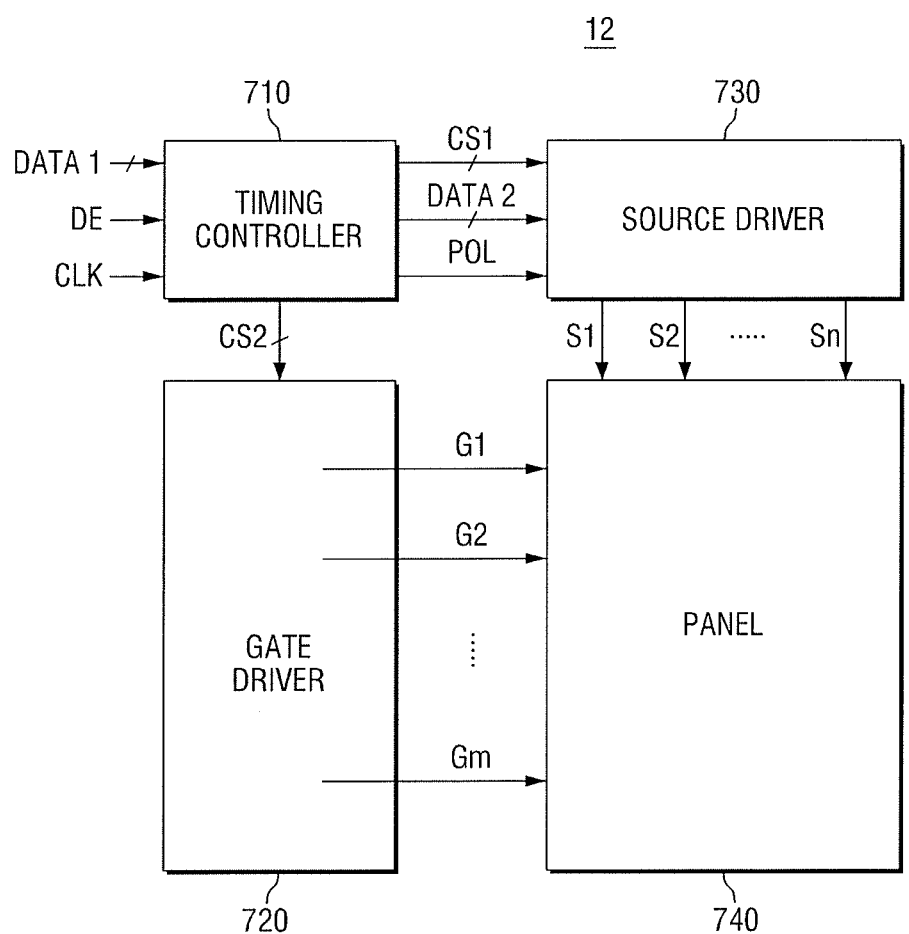
FIG. 9 illustrates a block diagram of a semiconductor system according to some example embodiments.

FIG. 9 is a block diagram illustrating a semiconductor system according to some example embodiments. A semiconductor system 12 in FIG. 9 is a more specific example of the semiconductor system 11 in FIG. 8. The semiconductor system 12 may be a display device. For example, the semiconductor chip 610 may correspond to a source driver 730, and the module 620 may correspond to a panel 740.

Referring to FIG. 9, the semiconductor system 12 may include a timing controller 710, a gate driver 720, the source driver 730, and the panel 740.

The panel 740 may include a plurality of gate lines G1 to Gm, a plurality of source lines S1 to Sn, and a plurality of pixels. Each of the plurality of pixels may be electrically connected to a corresponding gate line among the plurality of gate lines G1 to Gm, and to a corresponding source line among the plurality of source lines S1 to Sn.

Based on data DATA1, a data enable signal DE and a clock signal CLK, the timing controller 710 may generate a first control signal CS1, a second control signal CS2, data DATA2, and a polarity control signal POL.

The gate line driver 720 may drive the plurality of gate lines G1 to GM in response to the second control signal CS2. The source driver 730 may output an analog signal to the plurality of source lines S1 to Sn in response to the first control signal CS1, data DATA2 and the polarity control signal POL. An analog voltage may be inverted by a common voltage of the panel 740 in response to the polarity control signal POL.

Next, a method of manufacturing a semiconductor device according to some example embodiments will be described with reference to FIGS. 1 and 10-13.

FIGS. 10 through 13 are views illustrating intermediate process operations in a method of manufacturing a semiconductor device according to some example embodiments. In some example embodiments, FIGS. 10 through 13 are views of intermediate process operations for manufacturing the first transistor 21 in the first region I in FIG. 1.

Figure 10:
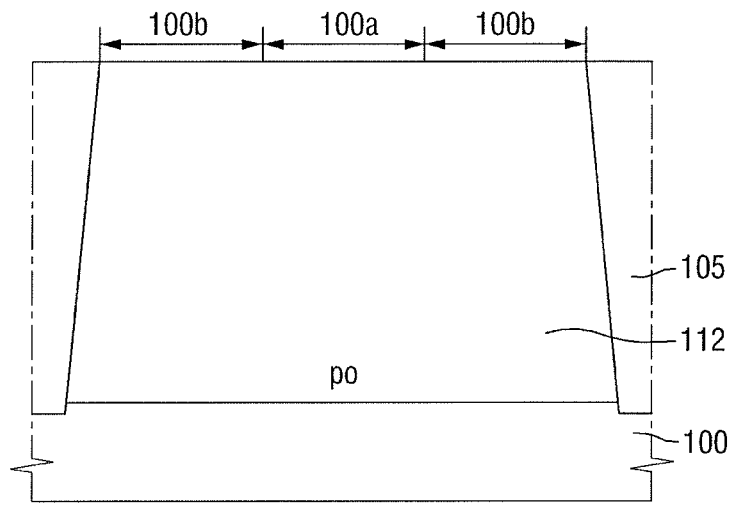
FIGS. 10 through 13 illustrate views of intermediate process operations in a method of manufacturing a semiconductor device according to some example embodiments.

Referring to FIG. 10, the device isolation region 105 may be formed in the substrate 100 to delimit the active region.

A portion of the substrate 100 (i.e., an active region) that is delimited by the device isolation region 105 may include a first portion 100a and a second portion 100b. At least two second portions 100b may be situated at opposite sides of the first portion 100a. The first well 112 that has a P-type conductivity (i.e., p0) may be formed in a portion of the substrate 100 delimited by the device isolation region 105. The first well 112 may be formed through, e.g., an ion implantation process, but it is not limited thereto.

Figure 11:
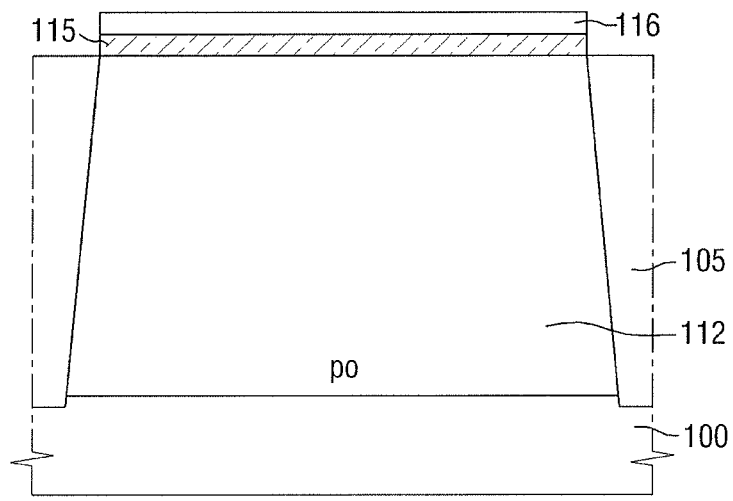

Referring to FIG. 11, the first silicon-germanium layer 115 and the first silicon capping layer 116 may be sequentially formed on the substrate 100. The first silicon-germanium layer 115 and the first silicon capping layer 116 may be grown through, e.g., an epitaxial growth process.

The first silicon-germanium layer 115 may be grown using the substrate 100 exposed by the device isolation region 105 as a seed. The first silicon-germanium layer 115 may include a selective epitaxial layer. The first silicon-germanium layer 115 and the first silicon capping layer 116 that are epitaxially grown may be an undoped silicon-germanium layer and an undoped silicon layer, respectively.

Figure 12:
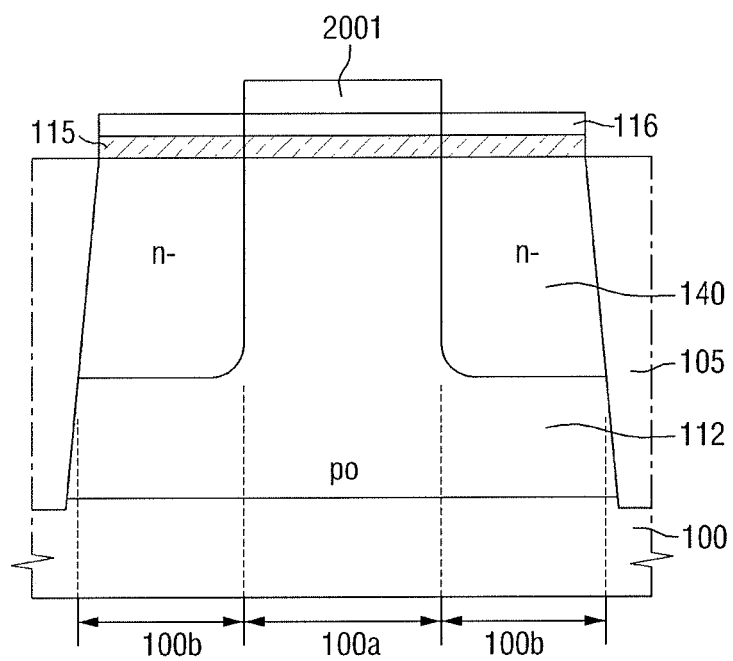

Referring to FIG. 12, a mask pattern 2001 may be formed on the first silicon capping layer 116 to be vertically juxtaposed with the first portion 100a of the substrate 100.

The pair of first source/drain extension regions 140 having N-type impurity (n−) may be formed in the second portion 100b of the substrate 100, the first silicon capping layer 116, and the first silicon-germanium layer 115. The pair of first source/drain extension regions 140 may be formed in the first well 112 at opposite sides of the mask pattern 2001, respectively.

The first source/drain extension region 140 may be formed through injecting an N-type impurity within the second portion 100b of the substrate 100, the first silicon capping layer 116, and the first silicon-germanium layer 115 using the mask pattern 2001. The first source/drain extension region 140 may be formed prior to forming the first gate electrode 120 (refer to FIG. 13). Next, the mask pattern 2001 may be removed.

Figure 13:
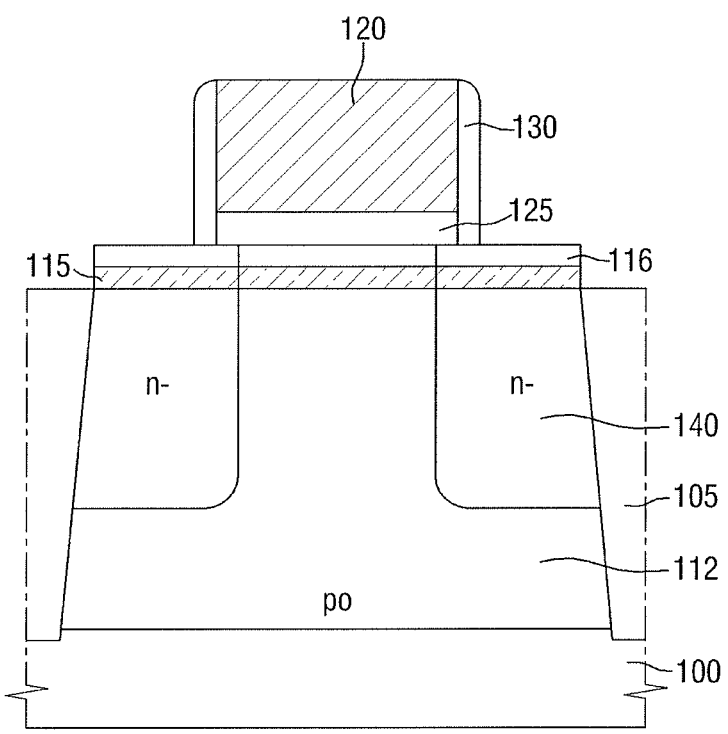

Referring to FIG. 13, the first gate insulation layer 125 and the first gate electrode 120 may be formed on the first silicon capping layer 116 between the first source/drain extension regions 140. The pair of first gate spacers 130 may be formed on both sidewalls of the first gate electrode 120.

Referring back to FIG. 1, the pair of first source/drain regions 145 having an N-type impurity may be formed within the first source/drain extension regions 140, respectively, using the first gate electrode 120 as a doping mask. The depth d12 to which the first source/drain region 145 is formed may be less than the depth d11 to which the first source/drain extension region 140 is formed.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. An integrated circuit device, comprising:
a substrate including a first region and a second region;
a first transistor in the first region, the first transistor being an N-type transistor and including:
a first P-type well in the substrate,
a first silicon-germanium layer on the substrate, and
a first gate electrode on the first silicon-germanium layer, the first silicon-germanium layer being between the first P-type well and the first gate electrode,
wherein a highest P-type impurities concentration within the first silicon-germanium layer is at an interface between the first silicon-germanium layer and the first P-type well; and
a second transistor in the second region and including a second gate electrode, the second transistor not having a silicon-germanium layer between the substrate and the second gate electrode.

2. The device as claimed in claim 1, wherein the first transistor further comprises a silicon capping layer between the first silicon-germanium layer and the first gate electrode.

3. The device as claimed in claim 2, wherein a P-type impurity concentration of the silicon capping layer is less than a P-type impurity concentration of the first P-type well.

4. The device as claimed in claim 1, wherein the first transistor further comprises source/drain extension regions at opposite sides of the first gate electrode, and source/drain regions at opposite sides of the first gate electrode, a depth of each of the source/drain extension regions being greater than a depth of each of the source/drain regions.

5. The device as claimed in claim 1, wherein the second transistor is a P-type transistor including source/drain extension regions at opposite sides of the second gate electrode, and source/drain regions at opposite sides of the second gate electrode, a depth of each of the source/drain extension regions being greater than a depth of each of the source/drain regions.

6. The device as claimed in claim 5, further comprising a third transistor in a third region of the substrate, the third transistor being a P-type transistor,
wherein the third transistor includes a second silicon-germanium layer on the substrate, a second P-type well in the substrate with a smaller depth than the first P-type well, and a third gate electrode on the second silicon-germanium layer, and
wherein an operating voltage level of the second transistor is greater than an operating voltage level of the third transistor.

7. The device as claimed in claim 1, wherein the second transistor is an N-type transistor, an operating voltage level of the first transistor being different from an operating voltage level of the second transistor.

8. The device as claimed in claim 7, wherein:
the first transistor further comprises a first gate insulation layer between the first gate electrode and the first silicon-germanium layer,
the second transistor further comprises a second gate insulation layer between the second gate electrode and the substrate, and
a thickness of the first gate insulation layer is greater than a thickness of the second gate insulation layer.

9. The device as claimed in claim 7, wherein the second transistor further comprises source/drain extension regions at opposite sides of the second gate electrode, and source/drain regions at opposite sides of the second gate electrode, a depth of each of the source/drain extension regions being less than a depth of each of the source/drain regions.

10. An integrated circuit device, comprising:
a substrate including a first region and a second region;
a first transistor in the first region, the first transistor being an N-type transistor and including:
a first silicon-germanium layer on the substrate, and
a first gate electrode on the first silicon-germanium layer;
a second transistor in the second region and including a second gate electrode, a width of the first gate electrode being greater than a width of the second gate electrode; and
a third transistor in a third region of the substrate, the third transistor being a P-type transistor, and only one of the second and third transistors including an additional silicon-germanium layer on the substrate.

11. The device as claimed in claim 10, wherein:
the first transistor further comprises a first gate insulation layer between the first gate electrode and the first silicon-germanium layer,
the second transistor further comprises a second gate insulation layer between the second gate electrode and the substrate, and
a thickness of the first gate insulation layer is greater than a thickness of the second gate insulation layer.

12. The device as claimed in claim 10, wherein the second transistor is a P-type transistor, the second transistor further including the additional silicon-germanium layer between the substrate and the second gate electrode.

13. The device as claimed in claim 12,
wherein the third transistor includes a third gate electrode on the substrate, a width of the third gate electrode being greater than a width of the second gate electrode, and
wherein the third transistor does not include the additional silicon-germanium layer between the substrate and the third gate electrode.

14. The device as claimed in claim 10, wherein the second transistor is an N-type transistor, the second transistor not including the additional silicon-germanium layer between the substrate and the second gate electrode.

15. The device as claimed in claim 14,
wherein the third transistor includes:
the additional silicon-germanium layer on the substrate; and
a third gate electrode on the additional silicon-germanium layer.

16. The device as claimed in claim 10, wherein:
the first transistor further comprises first source/drain extension regions at opposite sides of the first gate electrode, and first source/drain regions at opposite sides of the first gate electrode,
the second transistor further comprises second source/drain extension regions at opposite sides of the second gate electrode and second source/drain regions at opposite sides of the second gate electrode,
a depth of each of the first source/drain extension regions is greater than a depth of each of the first source/drain regions, and
a depth of each of the second source/drain extension regions is less than a depth of each of the second source/drain regions.

17. The device as claimed in claim 10, wherein the first region is a high voltage transistor region and the second region is a low voltage transistor region.

18. An integrated circuit device, comprising:
a substrate including a first region and a second region;
a first transistor in the first region, the first transistor being an N-type transistor and including:
a first doped well within the substrate,
a first gate electrode on the substrate, and
a first silicon-germanium layer between the first gate electrode and the substrate; and
a second transistor in the second region and including a second gate electrode on a second doped well, a distance between a bottom of the second gate electrode and a top of the substrate being smaller than a distance between a bottom of the first gate electrode and the top of the substrate, and a depth of the first doped well being larger than a depth of the second doped well.

19. The device as claimed in claim 18, wherein:
the first transistor further comprises a capping layer and a first gate insulating layer, the first doped well, the first silicon-germanium layer, the capping layer, and the first gate insulating layer being stacked on the substrate in the stated order, and
the second transistor further comprises a second gate insulating layer directly between the second gate electrode and the substrate.

* * * * *